United States Patent [19]

Schaus et al.

[11] Patent Number: 5,275,686
[45] Date of Patent: Jan. 4, 1994

[54] RADIAL EPITAXIAL REACTOR FOR MULTIPLE WAFER GROWTH

[75] Inventors: Christian F. Schaus; Eric A. Armour; Kang Zheng; Shang-Zhu Sun; David P. Kopchik, all of Albuquerque, N. Mex.

[73] Assignee: University of New Mexico, Albuquerque, N. Mex.

[21] Appl. No.: 765,636

[22] Filed: Sep. 25, 1991

[51] Int. Cl.⁵ ............................................. C30B 25/14
[52] U.S. Cl. ................................... 156/610; 156/611; 156/612; 156/613; 156/614
[58] Field of Search ............... 156/610, 611, 612, 613, 156/614

[56] References Cited

U.S. PATENT DOCUMENTS

| | | |
|---|---|---|
| 4,203,387 | 5/1980 | McMullen et al. ................. 156/611 |
| 4,518,455 | 5/1985 | Muething ............................ 156/611 |
| 4,649,859 | 3/1987 | Wanlass ............................... 156/611 |
| 4,907,534 | 3/1990 | Huang et al. ....................... 156/611 |
| 4,961,399 | 10/1990 | Frijlink ............................... 118/730 |
| 5,096,534 | 3/1992 | Ozias .................................. 156/611 |

FOREIGN PATENT DOCUMENTS

| | | | |
|---|---|---|---|
| 53-11576 | 2/1978 | Japan | ................................... 156/611 |
| 63-180424 | 8/1986 | Japan | ................................... 156/611 |
| 61-253822 | 11/1986 | Japan | ................................... 156/611 |

Primary Examiner—Robert Kunemund
Attorney, Agent, or Firm—Albert Sopp

[57] ABSTRACT

An improved gas distribution scheme for a multi-wafer radially injected convergent horizontal epitaxial reactor which includes two outer distribution rings, an outer injection ring, an annular susceptor, and a central exhaust tube. The converging path of the gas stream from the outer injection ring into the central exhaust tube compensates for depletion of the reactant gases along the substrate. The injector ring has a large number of evenly spaced diffuser orifices that allow the gas to expand into the growth chamber in a laminar flow pattern. The design is compact, includes the possibility of water cooling of the quartz during deposition, and allows for a resistive bakeout furnace which can be used to etch and clean the reaction chamber between runs.

6 Claims, 4 Drawing Sheets

RADIAL EPITAXIAL REACTOR FOR MULTIPLE WAFER GROWTH

BACKGROUND OF THE INVENTION

This invention relates to the epitaxial growth of semiconductor materials. Epitaxy is the process of forming a highly controlled crystalline layer on top of a crystalline substrate or wafer. The crystal structure for the epitaxial layer is usually identical or similar to that of the substrate, however it may contain different intentionally introduced impurities or be of a different material composition. Epitaxy is used in the creation of many types of electronic devices, including laser diodes, high mobility transistors, and optoelectronic integrated circuits.

There are presently several techniques used to grow epitaxial films. The most common approaches are by physical deposition (such as molecular beam epitaxy), chemical vapor deposition, or liquid phase epitaxy. This invention pertains to chemical vapor deposition (CVD), whereby the epitaxial layers are formed by the thermal decomposition (pyrolysis) of reactant gases above a heated substrate. The system is usually a cold-wall reactor, whereby only the substrate is heated and the reaction chamber walls are unheated. Heating of the substrate is usually accomplished by thermal contact with a graphite susceptor, which is heated using an infrared or ultraviolet light source, a proximity resistive heater, or an inductive radio frequency (RF) system.

The pyrolysis process takes place within a reaction chamber. A carrier gas, usually ultrapure hydrogen, containing carefully controlled amounts of the reactant gases, flows through this chamber and over the heated substrate. The transport of the reactants over the substrate and their resulting thermochemical reactions makes CVD a very complex process where small changes can have large effects. Hence, the design of the reaction chamber is critical for successful, controlled, uniform deposition.

Once the reactant gases start to thermally decompose over the substrate, the amount of unreacted gas is reduced. The carrier gas downstream of the susceptor will have less constituent reactants than that near the upstream edge of the heated substrate. This effect is known as reactant depletion. In order to provide uniform gas composition across the substrate, the gas flow must be laminar and some method to compensate for reactant depletion must be used. Again, the design of the reaction chamber is critical to assure a uniform, laminar gas flow.

The design of the gas handling section is another critical aspect of the reactor system. In order to achieve thin epitaxial layers such as quantum wells, it is necessary to have a short, but controlled, transit time of the reactants over the substrate. It is thus necessary to have both abrupt switching of the reactants into the growth chamber and also high gas velocities within the reaction chamber. The abrupt switching is accomplished by a run-vent manifold system that switches the reactants between the reaction chamber and a vent line that bypasses the reactor chamber. The vent line is reconnected to the exhaust system downstream. Both the reaction chamber and vent line must be pressure-balanced to prevent unnecessary transients to the gas stream. Higher gas velocities are accomplished by maintaining the reaction chamber and exhaust system at sub-atmospheric pressures, typically between 50 and 100 Torr.

There are three general types of reaction chamber geometries used for chemical vapor deposition, which are delineated by the direction of gas flow relative to the substrate surface. In horizontal systems, the wafer is placed on top of a boat or a susceptor with its face is parallel to the gas stream or slightly angled to prevent reactant depletion. Conventional horizontal reactors are linear. The gas is injected from the manifold at one end, passed over the substrate in the middle and removed by the exhaust system at the other end. In vertical systems, the gas flow is perpendicular to the surface of the substrate. Again, the gas flow is linear. It is injected at the top of the chamber and collected at the bottom. The third type of system is the barrel which is a hybrid of the first two. It is generally used for large scale wafer growth. The substrates are placed on a cylindrical or conical shaped barrel, and the reactant gases are injected vertically from the top and collected at the bottom. The reaction chamber shape is very much like a vertical reactor, but the gas flow over the substrates is similar to the flow in a horizontal reactor. For all three systems, the susceptor area is usually rotated to provide more uniform gas and temperature distributions.

However, traditional multiple substrate reactors have uniformity problems if their reaction chamber design prevents the use of a viable rotation system. Even in systems that have substrate rotation, substrate-to-substrate nonuniformity exists and the growth characteristics will change with the number of substrates in the reactor.

Another traditional problem with CVD systems is that even though these systems are usually cold-wall reactors, some of the reactants are still deposited on the interior walls of the reaction chamber. Typical reaction chamber geometries do not allow for water-cooling the quartz reactor walls during deposition and prevent the use of an in-situ bakeout method to clean the inside of the reaction chamber between growth runs.

SUMMARY OF THE INVENTION

The present invention provides an improved reactor having a novel chamber configuration and flow system for multiple wafer vapor phase epitaxy particularly for metal-organic chemical vapor deposition (MOCVD), although it can be used for any type of vapor phase epitaxial process. The arrangement provided by the invention improves the uniformity of gas composition across the reaction area and maintains laminar flow paths, essentially by providing a radially converging gas flow path horizontally across the susceptor. As the reactants pass radially inwardly towards the central exhaust line, they are depleted. However, in accordance with the invention this depletion is compensated by the concentration of gases as they radially converge.

The advantageous flow system of the invention provides a novel reactor well suited for a large number and variety of wafers. The compositional uniformity of the gas is maintained by the radially converging geometry and concomitant converging reactant gases. The circumference of the distribution ring puts limits on the number of wafers that could be put in a reactor of this type and not the area of the susceptor. The susceptor area scales with chamber radius squared, but the circumference only scales with chamber radius. This allows for larger chambers and thus more wafers that can be exposed to the compositionally uniform gas.

Since the design is radially symmetric, the growth characteristics for a single wafer and for multiple wafers are the same if the same growth conditions are used. Previous radial designs such as disclosed in U.S. Pat. No. 4,961,399 inject the reactant gases into and radially outward from the center of the susceptor and collect the gases at the outer ring. This format results in a diverging gas stream that enhances the effects of reactant depletion. Without the use of a planetary rotation scheme such as is described in the patent, the reactor geometry produces a very non-uniform growth rate across the susceptor.

One limitation with most current vertical and radial reactor designs is that they do not have the capability of an in-situ cleaning method to reduce wall deposits. Hence, a further object of the invention is to incorporate a hot-wall heating section to allow an in-situ bakeout etch step between growths. This high temperature bakeout step uses an etching gas such as hydrogen chloride to remove extraneous deposited reactants from all parts of the reaction chamber.

In the reactor geometry according to the invention, the reactant gases are first distributed around the outer edge of the reaction chamber in two counter-propagating distribution rings, and then injected radially inward into the reaction chamber through an injector ring. This arrangement uniformly distributes the reactant gases to the reaction chamber. The twin distribution ring design separates the gas precursors which may react rapidly with each other. Such gas phase interactions occur during the growth of indium phosphide (InP) and related compounds. The reactive precursors are kept separated in two distribution rings until they are injection through the orifices of the injector ring into the reaction chamber. In order to have separate distribution rings, two separate fast gas-switching manifolds and vent lines are employed. The counter-propagating property of the injection rings provides increased mixing of the reactant gases in the injector ring orifices to obtain a homogeneous reactive gas flow in the reaction chamber.

The distribution rings are at a higher pressure than the reaction chamber. The pressure drop across the orifices would cause turbulent flow patterns if they were connected directly to the reaction chamber. To minimize turbulent flow, the orifices are connected to an expanding diffuser section which injects the gases into the reaction chamber. Together with the orifices, these diffusers form the injection ring. The expansion of the gas across the injection ring is controlled by the the geometry of the diffuser and several gas flow parameters, such as pressure, flow rate and gas density. Since the diffusers have a low expansion angle, the gas phase fronts are laminar, an important feature in providing the required uniform gas composition across the reaction area.

To further help with uniform deposition, a planetary susceptor rotation scheme, such as that described in U.S. Pat. No. 4,961,399 may be used. In U.S. Pat. No. 4,961,399 the hydrogen drive gas lines for both the planets and the main ring are injected through concentric funnels into and away from the center of the susceptor. To compensate for the central exhaust tube in our line, concentric rings around the exhaust tube are used for gas distribution to the foil drive.

In accordance with the invention, the reactor and exhaust system is designed to be operated at pressures in the range of about 10 to about 100 Torr. The relatively low pressures are necessary to increase the gas velocities around the distribution and injector rings. A high gas velocity in the distribution rings maintains radially uniform gas composition and fast switching speeds. A high gas velocity across the susceptor assures the ability to grow abrupt, sharply defined interfaces at fast growth rates.

Vacuum pumps in the exhaust system operate the reactor at low pressures. These pumps are protected from contaminants by a liquid nitrogen trap located downstream of the reaction chamber. The trap condenses unreacted gas species into a solid form which can be collected by either the trap or a downstream filter. A carbon scrubber unit can be used in a similar manner. The reaction chamber geometry allows the trap section to be placed below the susceptor area, thus reducing particulate generation that occurs during the loading of the wafers.

The two vent lines, one for each gas-switching manifold, are injected into the exhaust system on the downstream side of the liquid nitrogen trap. The vent lines are physically connected the exhaust system at separate locations on the liquid nitrogen trap housing to further prevent gas phase interactions. The geometry of the vent connection reduces the chance of gases emitted from the vent flowing backwards into the reaction chamber.

The radially converging horizontal geometry of this reactor according to the invention allows for a simple, compact design. This makes the reactor easy to clean and maintain. It also makes it easy to remove the wafers through the top instead of the contaminated exhaust end as is necessary with most traditional horizontal reactors.

BRIEF DESCRIPTION OF THE DRAWINGS

Reference is now made to the drawings in which like numerals refer to like parts and in which.

DESCRIPTION OF PREFERRED EMBODIMENTS

Figure 1:
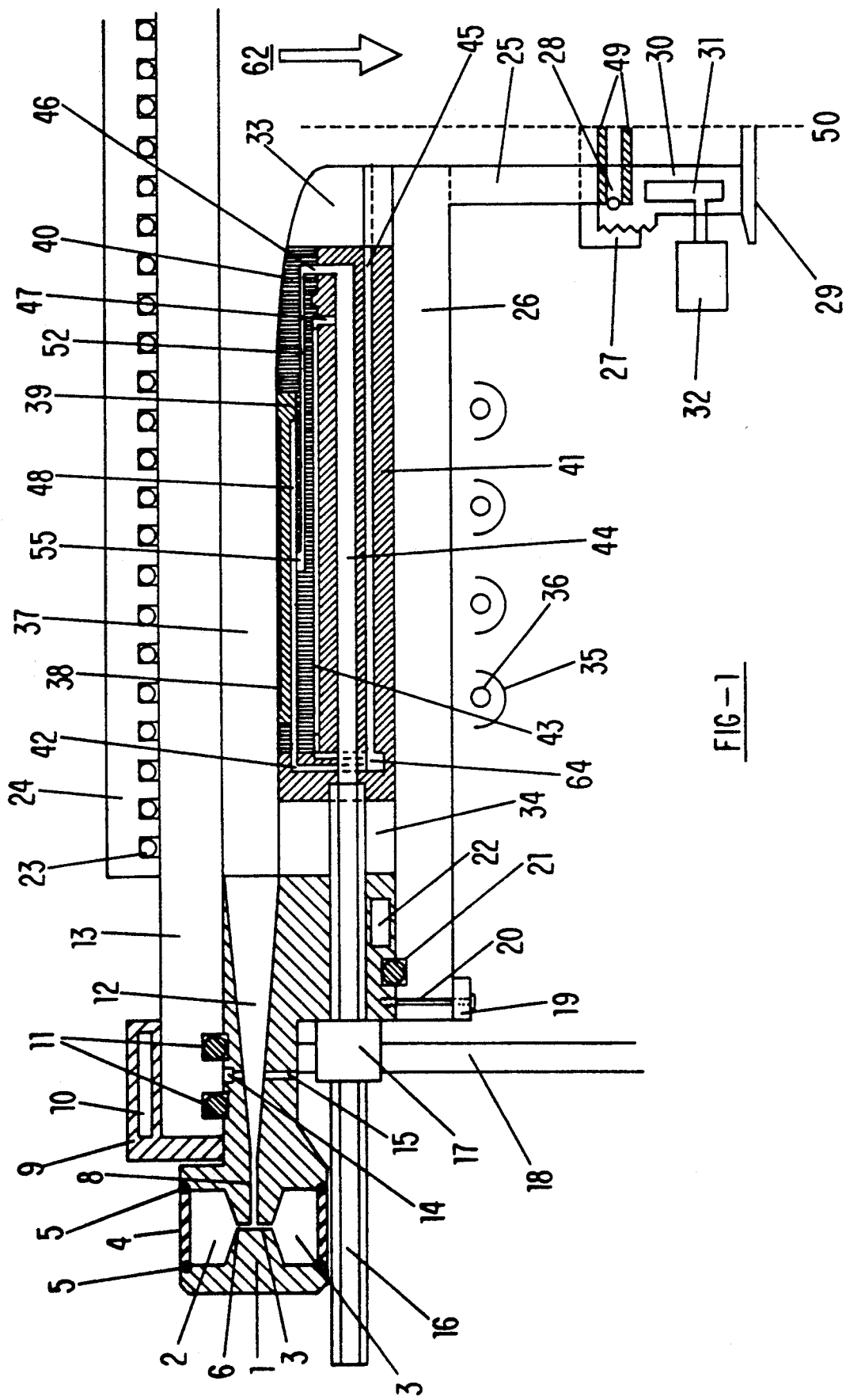
FIG. 1 is a cross-sectional view of half the reactor, which being radially symmetric, is a mirror-image of the other half, in accordance with an embodiment of the invention.
Figure 2:
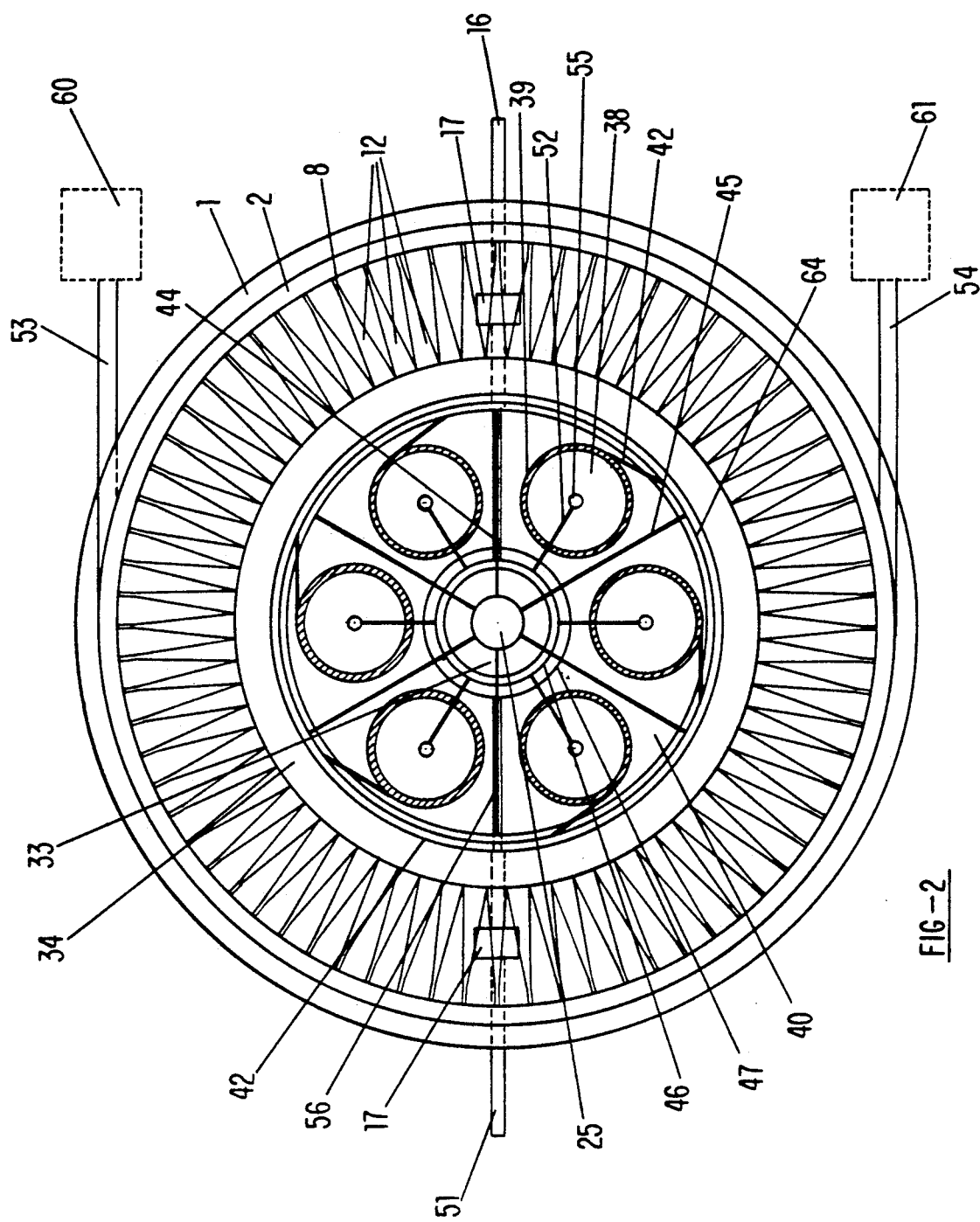
FIG. 2 is a top view of the reactor interior in accordance with an embodiment of the invention showing the gas flows within the reactor, both for the reactants and the gas-driven rotation system.
Figure 3:
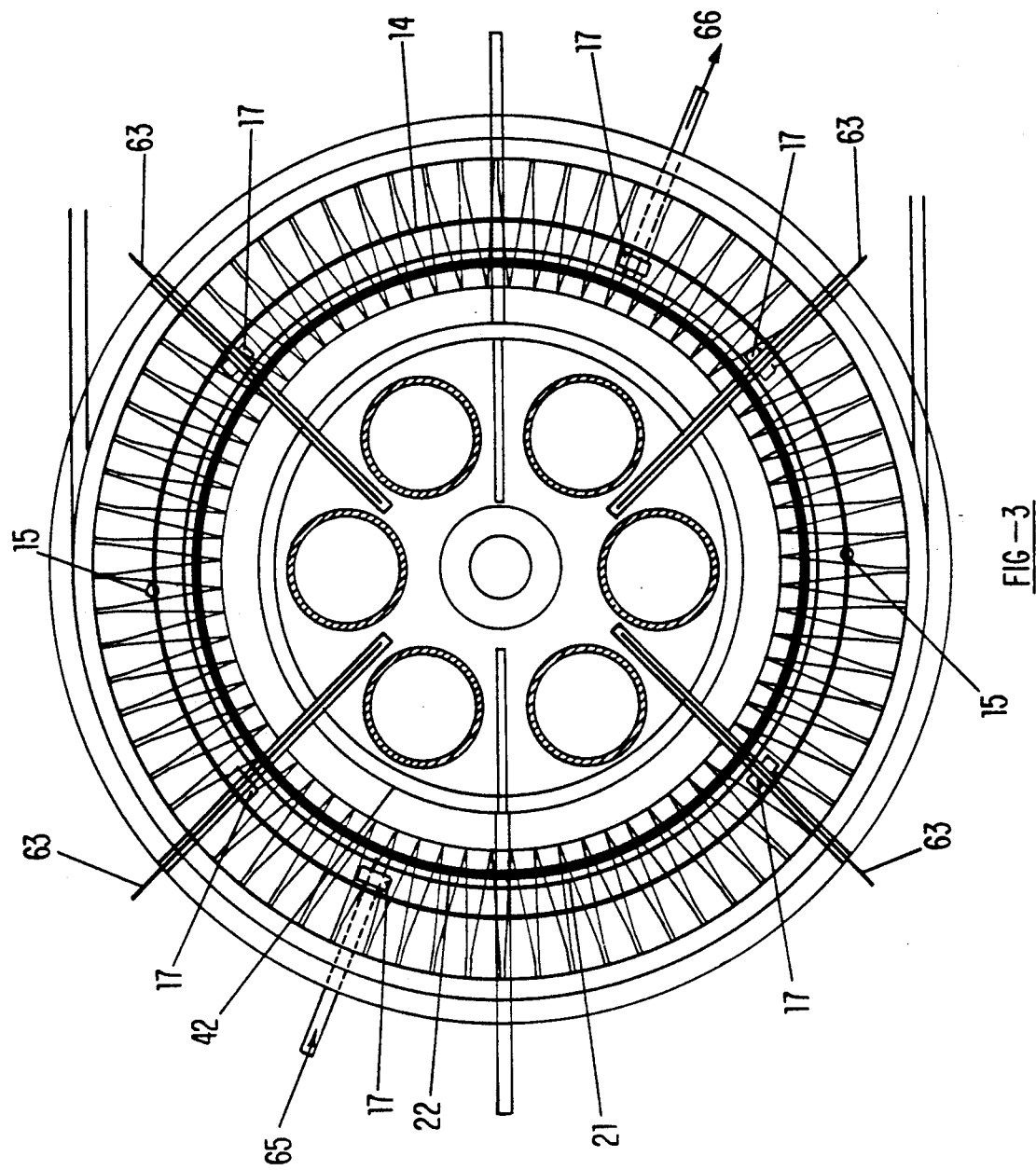
FIG. 3 is a bottom view of the reactor in accordance with an embodiment of the invention illustrating the thermocouple positions, the vacuum seal lines, and the water cooling ring for the main injector block 1.

Referring to FIG. 1, the main gas injection system is composed of several components milled out of an injector 1 composed of stainless steel. The injector 1 has two circular distribution chambers or manifolds 2 and 3 for distribution of the gases. As shown in FIGS. 2 and 3, the described configuration consists of 72 injectors each equally spaced to define sections at 5° around the ring. Each injector section consists of a pair of orifices 6, a connection channel 7, connecting manifolds 2 and 3, a mixing tube 8, and an expansion diffuser 12. The injector 1 and diffusers 12 are radially symmetric with respect to the axis of rotation designated as 50. To ease the fabrication requirements of the injector 1, the chambers 2 and 3 may be sealed by ring caps 4 connected to the injector 1 with full penetration welds 5.

To prevent gas phase interactions between two classes of reactants (designated as A and B), the two distribution chambers 2 and 3 keep the reactants separated until they are mixed in channel 7 in each injector section. Reactant A is introduced into the top distribution chamber 2 through tube 53 from the reactant A gas switching supply 60. Reactant B is introduced into the bottom distribution chamber 3 through tube 54 connected to the reactant B gas switching supply 61. The geometry of the injector tubes 53 and 54 causes the class A reactants to circulate in a counter-clockwise flow 57 and the class B reactants to circulate in a clockwise flow 58.

Figure 4:
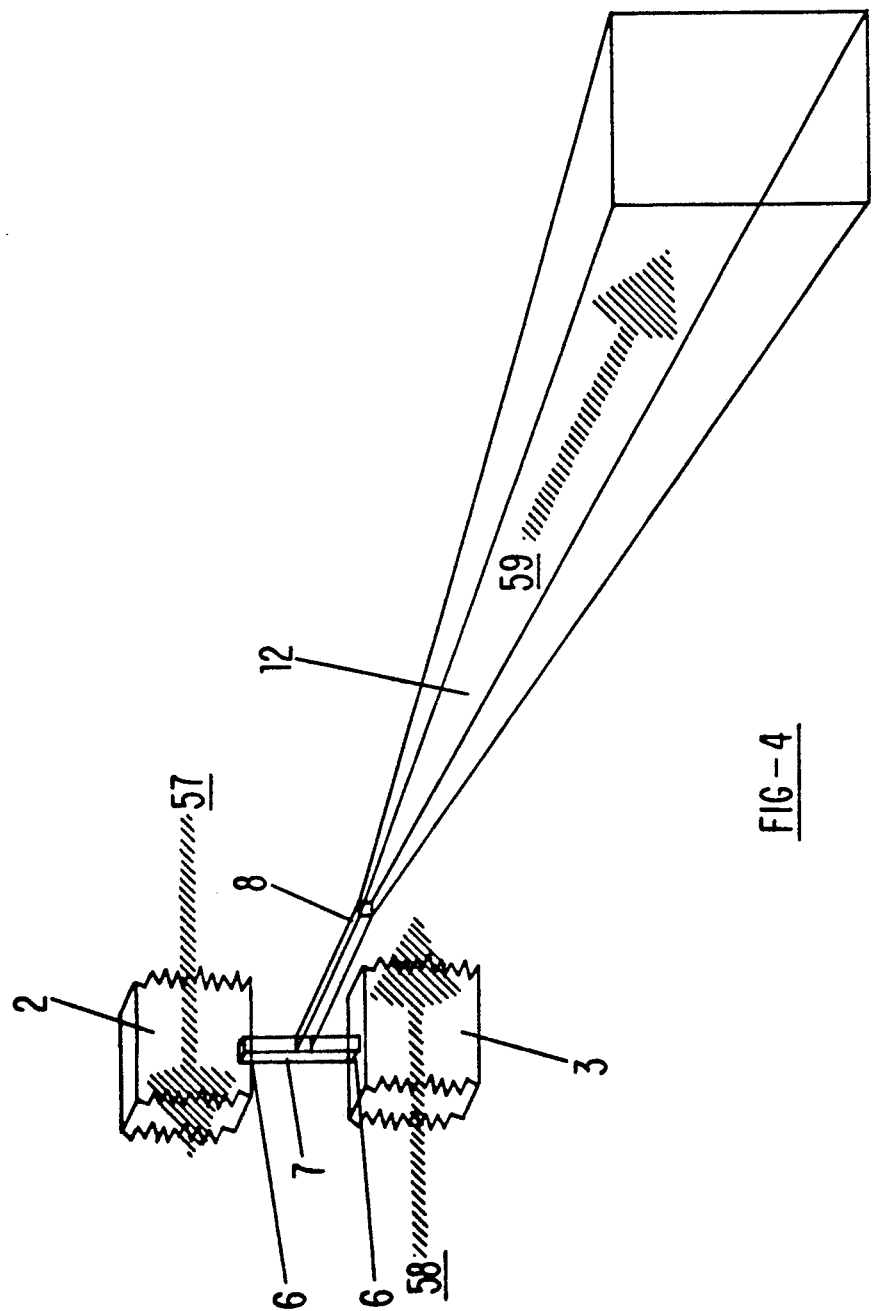
FIG. 4 is a three-dimensional view of one diffuser section connected to the two distribution rings in accordance with an embodiment of the invention.

As the reactant gases rotate around chambers 2, 3, the gases flow through aperture 6 into a vertical channel 7 which connects the two distribution passages 2, 3. The vertical channel 7 connects the two distribution passages 2, 3 to the horizontal mixing tube 8 which mixes the reactants. At this point, the flow is at high speed and is quite turbulent. The gas flow velocity is reduced and is spread out in a laminar flow pattern 59 (see FIG. 4) by a shallow angle expanding diffuser section 12 which follows the horizontal mixing section 8. After the reactants pass through the expanding diffusers 12, they enter the main reaction chamber 37 and converge towards the central exhaust tube 62. As they converge, they pass over the graphite susceptor area 39, 40, 41.

The reaction vessel is formed by the cylindrical injector ring 1 which is hermetically sealed to a top quartz disk 13 and a bottom quartz disk 26. The top disk 13 is fastened to the injector block 1 by two O-rings 11 and a circular groove 14, cut into ring or block 1, that distributes a uniform vacuum seal around the edge of the disk 13. Two vacuum ports 15 are located at opposite sides of the chamber to provide sufficient evacuation of groove 14.

A resistive bakeout furnace consisting of heating elements 23 and a support frame 24 rests on top of the quartz disk or plate 13. The furnace provides hot-wall heating of the reaction chamber during cleaning cycles. During a growth sequence, the furnace 23, 24 may be removed and replaced by a water-cooled element (not shown) so that deposition on the quartz disk 13 is minimized and the growth surfaces may be examined. To prevent the sealing O-rings 11 from being damaged due to thermal conductance through the quartz disk 13, a removeable hollow ring 9 sits on the quartz disk 13. Inside the ring 9, water circulates through a cavity 10 which cools the injector ring or block 1 and quartz disk 13 near the O-rings 11.

As previously indicated, the bottom of the reaction chamber consists of the bottom quartz disk 26 welded to a quartz exhaust shaft 25. The quartz disk 26 is hermetically sealed to the injector block 1 using an O-ring 21 and a series of mounting bolts 20 which form a compression fit on a clamp ring 19. The mounting bolts 20 are distributed evenly in a circular array around the injector block 1. To prevent damage to the O-ring seal, an annular water cooling cavity 22 is integrated into the injector block 1. As shown in FIG. 3, the inlet 65 and outlet 66 ports to the cooling cavity are normal to the main injector ring or block 1 and are at the same vertical displacement as the rotation gas supply line 16 as shown in FIG. 1. The entire reaction vessel is supported by rods 18 which are mounted to the underside of the injector 1.

The quartz exhaust shaft 25 is connected to the stainless exhaust piping 30 using a compression seal system composed of an O-ring 28, stainless compression rings 49 and a threaded sealing ring 27. The exhaust pipe preferably may have a standard connection scheme such as a ISO KF-40 flange 29 as shown in FIG. 1. The O-ring seal is protected from thermal damage by a water cooling cavity 31 in the stainless steel exhaust pipe 30. Water is provided by an inlet connector 32 and removed by a similar outlet connector, which is not shown in the diagram.

During a growth cycle, the reactor is operated under cold-wall conditions, whereby the heating of the substrate 38 is accomplished by thermal contact with the heated graphite susceptor area 39, 40, 41. The susceptor is heated from the bottom using IR lamp bulbs 36 and reflectors 35 equally spaced and individually controlled as to provide a uniform temperature distribution within the entire susceptor ring. As shown in FIG. 3, monitoring of the temperature is accomplished using several thermocouples 63 protruding into the susceptor area 39, 40, 41 normal to the main injector block 1 and are also at the same vertical displacement as the rotation gas supply line 16. All lines normal to the injector block 1 are sealed with a compression fitting 17 to maintain a hermetic seal between the reaction chamber and the outside atmosphere.

The planetary levitation rotation scheme for this reactor is similar to that described in U.S. Pat. No. 4,961,399. However, since the central exhaust tube changes the symmetry of the reactor, the reactor of the invention has important differences. The susceptor area consists of a single wafer susceptor block 39, a planetary rotation ring 40, and a radial guard ring 41, all made of graphite. The gases for the wafer rotation are supplied by the previously mentioned injector tube 16. This injector tube 16 is inserted into a notch in the radial guard ring 41 and feeds an internal tube 44 connected to a central distribution ring 46. The radial guard ring 41 connects to the individual wafer levitation cavities 48 via a feed line 52 and indentation 55. The planetary ring rotation system employs a gas injector tube 51 inserted into a notch in the guard ring 41 which feeds an internal tube 56 connected to a central distribution arc 47. The distribution arc 47 is directly connected to the levitation cavity 43. The gas used for rotation for each wafer susceptor 39 drains from an orifice 42 into a central collection ring 64 which in turn drains into the exhaust tube 45. A diffuser spacer ring 34 is used to distance the susceptor from the expanding diffuser section 12. Another drain spacer ring 33 is used to form a smooth transition from the graphite susceptor section 39, 40, 41 to the drain. This spacer 33 is preferably angled downwards towards the exhaust shaft 25 rather than square therewith, to provide a more laminar path for the exhaust gas flow. It is preferable that these spacer rings 33, 34 be fabricated from machinable semiconductor-grade ceramic (i.e. Macore TM), which has a low thermal conductivity and high purity.

It should be recognized, by those knowledgeable in the area, that various changes, alterations, and modifications can be made to the structure, components, and materials mentioned in the preferred embodiments described herein without departing from the scope of the present invention.

We claim:

1. In the epitaxial growth of films on substrate material located in a central reaction region of a horizontal plane where the substrate material is to be exposed to one or more reactant gases to form a film thereon, a method for maintaining laminar flow and preventing depletion of the reactant gases comprising the steps of:
    (a) providing at and around the peripheral region of the horizontal plane the one or more reactant gases in a generally circular flow, and
    (b) directing the gases from a plurality of angularly spaced apart locations at the peripheral region of the horizontal plane in an inward direction and convergently to the central reaction region whereby the phase fronts of the gases are laminar and converging into each other, thereby providing an essentially uniformly distributed, non depleted gas composition in the central reaction region enabling essentially uniform growth rate of film on the substrate material.

2. The method of claim 1 wherein the step of directing includes the step of diffusing the gases.

3. The method of claim 1 wherein the step of providing includes at least two reactant gases flowing in opposite directions around the peripheral region.

4. The method of claim 3 wherein the step of directing includes the step of diffusing.

5. The method of claim 1 wherein the flow velocity of the gases is sufficient to enable growth of sharply defined interfaces in the film.

6. The method of claim 1 wherein the substrate material is rotated.

* * * * *